United States Patent
Morita et al.

(10) Patent No.: US 10,444,288 B2
(45) Date of Patent: Oct. 15, 2019

(54) ABNORMALITY DIAGNOSING DEVICE AND ABNORMALITY DIAGNOSING METHOD

(71) Applicant: FANUC CORPORATION, Yamanashi (JP)

(72) Inventors: Yuuki Morita, Yamanashi-ken (JP); Kenji Takahashi, Yamanashi-ken (JP); Tadashi Okita, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/968,004

(22) Filed: May 1, 2018

(65) Prior Publication Data
US 2018/0321319 A1  Nov. 8, 2018

(30) Foreign Application Priority Data

May 2, 2017 (JP) ................................. 2017-091515

(51) Int. Cl.
*H02K 17/32* (2006.01)
*G01R 31/34* (2006.01)
(Continued)

(52) U.S. Cl.
CPC ......... *G01R 31/343* (2013.01); *G01R 31/346* (2013.01); *H02H 1/00* (2013.01);
(Continued)

(58) Field of Classification Search
CPC ... G05B 2019/32368; H02P 3/04; H02M 1/38
See application file for complete search history.

(56) References Cited

U.S. PATENT DOCUMENTS 5,357,181 A    10/1994  Mutoh et al.
7,215,090 B2 *  5/2007  Kuramochi ............... H02P 3/04
                                                      188/158

FOREIGN PATENT DOCUMENTS

CN    102484438 A    5/2012
CN    102761309 A    10/2012
(Continued)

OTHER PUBLICATIONS

English Abstract and Machine Translation for Japanese Publication No. 2005-102409 A, published Apr. 14, 2005, 7 pgs.
(Continued)

*Primary Examiner* — Karen Masih
(74) *Attorney, Agent, or Firm* — Fredrikson & Byron, P.A.

(57) ABSTRACT

An abnormality diagnosing device diagnoses a driving abnormality of a single motor driven by a plurality of motor driving devices. The plurality of motor driving devices calculate a plurality of voltage command values based on a speed command, and voltages are applied to a plurality of windings possessed by the motor based on the plurality of calculated voltage command values, thereby driving the motor. The abnormality diagnosing device is equipped with a command value difference calculating unit for calculating a difference between the plurality of voltage command values calculated by the plurality of motor driving devices, and a determination unit for determining the presence of an abnormality, when an absolute value of the difference calculated exceeds a first threshold value continuously for a predetermined time period.

11 Claims, 6 Drawing Sheets

(51) Int. Cl.
  *H02P 3/18* (2006.01)
  *H02H 1/00* (2006.01)
  *H02P 29/10* (2016.01)
  *H02P 29/024* (2016.01)

(52) U.S. Cl.
  CPC ............ *H02P 3/18* (2013.01); *H02P 29/0241* (2016.02); *H02P 29/10* (2016.02)

(56) References Cited

FOREIGN PATENT DOCUMENTS

| | | | |
|---|---|---|---|
| CN | 105099325 | A | 11/2015 |
| JP | 11252986 | A | 9/1999 |
| JP | 200432849 | A | 1/2004 |
| JP | 2005-102409 | A | 4/2005 |
| JP | 2005304119 | A | 10/2005 |
| JP | 201041890 | A | 2/2010 |
| JP | 2012-147531 | A | 8/2012 |
| JP | 2013255330 | A | 12/2013 |
| JP | 2015233372 | A | 12/2015 |
| JP | 2016-001945 | A | 1/2016 |
| JP | 201610188 | A | 1/2016 |
| JP | 2016-201922 | A | 12/2016 |

OTHER PUBLICATIONS

English Abstract and Machine Translation for Japanese Publication No. 2012-147531 A, published Aug. 2, 2012, 13 pgs.
English Abstract and Machine Translation for Japanese Publication No. 2016-001945 A, published Jan. 7, 2016, 8 pgs.
English Abstract and Machine Translation for Japanese Publication No. 2016-201922 A, published Dec. 1, 2016, 10 pgs.
English Abstract and Machine Translation for Japanese Publication No. 2015-233372 A, published Dec. 24, 2015, 10 pgs.
English Abstract and Machine Translation for Japanese Publication No. 2010-041890 A, published Feb. 18, 2010, 11 pgs.
English Abstract and Machine Translation for Japanese Publication No. 2013-255330 A, published Dec. 19, 2013, 11 pgs.
English Abstract and Machine Translation for Japanese Publication No. 2016-010188 A, published Jan. 18, 2016, 19 pgs.
English Abstract and Machine Translation for Japanese Publication No. 2004-032849 A, published Jan. 29, 2004, 12 pgs.
English Abstract and Machine Translation for Japanese Publication No. 2005-304119 A, published Oct. 27, 2005, 11 pgs.
English Abstract and Machine Translation for Japanese Publication No. 11-252986 A, published Sep. 17, 1999, 12 pgs.
English Abstract and Machine Translation for Chinese Publication No. 102484438 A, published May 30, 2012, 30 pgs.
English Abstract and Machine Translation for Chinese Publication No. 102761309 A, published Oct. 31, 2012, 27 pgs.
English Abstract and Machine Translation for Chinese Publication No. 105099325 A, published Nov. 25, 2015, 29 pgs.

\* cited by examiner

ABNORMALITY DIAGNOSING DEVICE AND ABNORMALITY DIAGNOSING METHOD

CROSS-REFERENCE TO RELATED APPLICATION

This application is based upon and claims the benefit of priority from Japanese Patent Application No. 2017-091515 filed on May 2, 2017, the contents of which are incorporated herein by reference.

BACKGROUND OF THE INVENTION

Field of the Invention

The present invention relates to an abnormality diagnosing device and an abnormality diagnosing method for diagnosing a driving abnormality of a single motor that is driven by a plurality of motor driving devices.

Description of the Related Art

In Japanese Laid-Open Patent Publication No. 2005-102409, a printing device is disclosed that detects an abnormality in relation to a motor driving device that controls a motor. To provide a brief description thereof, the printing device comprises a plurality of phase detection circuits connected to each of a plurality of motor phases (A-phase, *A-phase, B-phase, *B-phase), and including a first detection circuit adapted to detect the occurrence of an abnormality in relation to pulses output to the motor phases, and a second detection circuit adapted to detect the occurrence of an overcurrent in the motor phases, and logic output devices that perform logic outputs indicating abnormalities in relation to the motor driving device on the basis of the detection results from the plurality of phase detection circuits.

SUMMARY OF THE INVENTION

However, in Japanese Laid-Open Patent Publication No. 2005-102409, an abnormality in relation to the motor driving device is detected when a single motor is driven by one motor driving device, and no consideration is given to a case in which a motor driving abnormality is detected when a single motor is driven by a plurality of motor driving devices.

Thus, the present invention has the object of providing an abnormality diagnosing device and an abnormality diagnosing method that enables diagnosis of a driving abnormality of a single motor that is driven by a plurality of motor driving devices.

A first aspect of the present invention is characterized by an abnormality diagnosing device adapted to diagnose a driving abnormality of a single motor that is driven by a plurality of motor driving devices, wherein the plurality of motor driving devices calculate a plurality of voltage command values on the basis of a position command or a speed command commanded from a numerical controller, and based on the plurality of calculated voltage command values, voltages are applied to a plurality of windings possessed by the motor, thereby driving the motor, the abnormality diagnosing device comprising a command value difference calculating unit adapted to calculate a difference between the plurality of voltage command values calculated by the plurality of motor driving devices, and a determination unit adapted to determine the presence of an abnormality, in the event that an absolute value of the difference calculated by the command value difference calculating unit exceeds a first threshold value continuously for a predetermined time period.

A second aspect of the present invention is characterized by an abnormality diagnosing method for diagnosing a driving abnormality of a single motor that is driven by a plurality of motor driving devices, wherein the plurality of motor driving devices calculate a plurality of voltage command values on the basis of a position command or a speed command commanded from a numerical controller, and based on the plurality of calculated voltage command values, voltages are applied to a plurality of windings possessed by the motor, thereby driving the motor, the abnormality diagnosing method comprising a command value difference calculating step of calculating a difference between the plurality of voltage command values calculated by the plurality of motor driving devices, and a determining step of determining the presence of an abnormality, in the event that an absolute value of the difference calculated by the command value difference calculating step exceeds a first threshold value continuously for a predetermined time period.

According to the present invention, with a simple configuration, a driving abnormality of a single motor that is driven by a plurality of motor driving devices can be diagnosed.

The above and other objects, features, and advantages of the present invention will become more apparent from the following description when taken in conjunction with the accompanying drawings, in which preferred embodiments of the present invention are shown by way of illustrative example.

DESCRIPTION OF THE PREFERRED EMBODIMENTS

Preferred embodiments of an abnormality diagnosing device and an abnormality diagnosing method according to the present invention will be presented and described in detail below with reference to the accompanying drawings.

Figure 1:
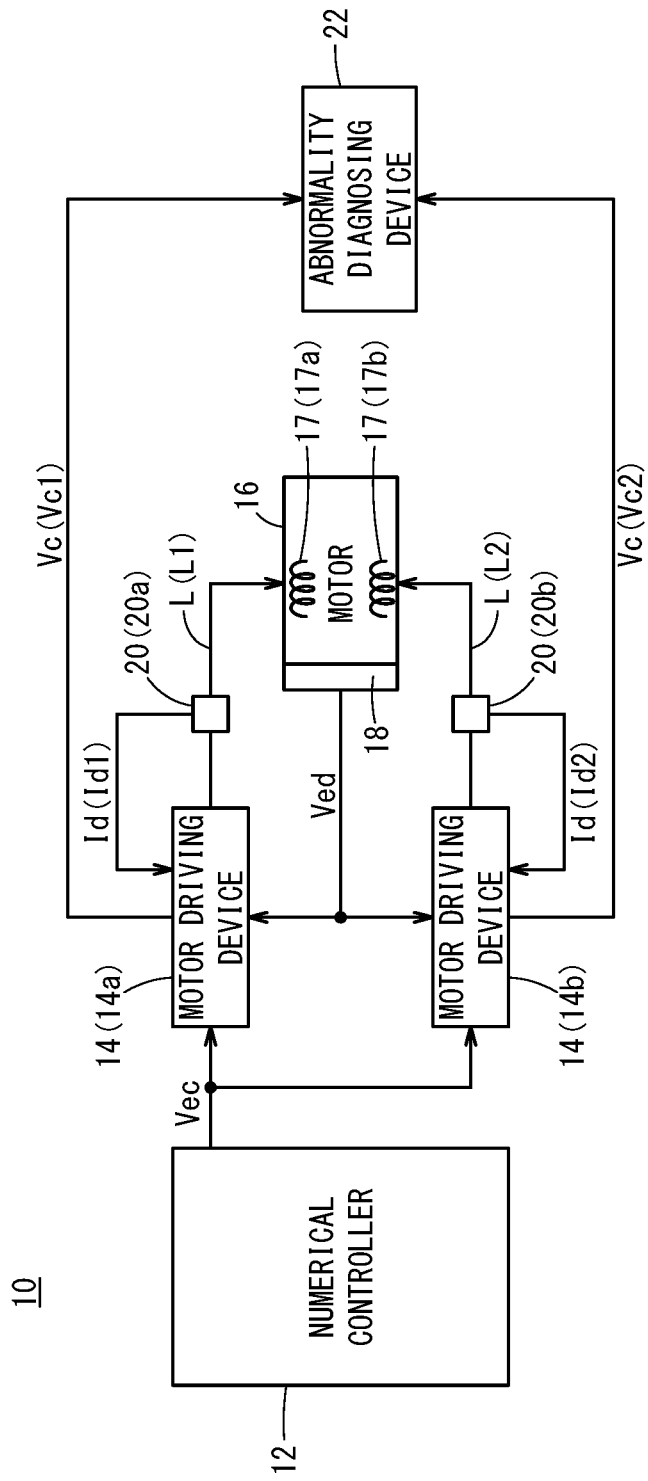
FIG. 1 is a schematic configuration diagram of an abnormality diagnosis system according to an embodiment of the present invention.

FIG. 1 is a schematic configuration diagram of an abnormality diagnosis system 10. The abnormality diagnosis system 10 is equipped with a numerical controller 12, a plurality of motor driving devices 14, a motor 16, a rotational speed detecting unit 18, current detecting units 20, and an abnormality diagnosing device 22.

According to the present embodiment, in order to simplify the description, it is assumed that the number of motor driving devices 14 is two, and the rotation of a single motor 16 is controlled by using the two motor driving devices 14. Further, in order to distinguish the two motor driving devices 14 from each other, in certain cases, one of the motor driving devices 14 may be represented by 14a, and the other of the motor driving devices 14 may be represented by 14b.

The motor 16 is a synchronous motor. Corresponding to the two motor driving devices 14 (14a, 14b), the motor 16 has two windings of three phases (three-phase windings) 17 including a U-phase, a V-phase, and a W-phase. The three-phase winding 17 corresponding to the motor driving device 14a is referred to as a first winding (winding) 17a, and the three-phase winding 17 corresponding to the motor driving device 14b is referred to as a second winding (winding) 17b in certain cases. The first winding 17a and the second winding 17b are disposed on a stator of the motor 16. In accordance therewith, it is possible to increase the output (rotational force) of the motor 16. The two motor driving devices 14 (14a, 14b) and the two windings 17 (17a, 17b) are connected by three-phase conductive wires L (L1, L2). According to the present embodiment, the motor 16 is a synchronous motor; however, the motor 16 may be a motor other than a synchronous motor (for example, an induction motor).

In order to control the motor 16, the numerical controller 12 outputs a speed command or a position command to the two motor driving devices 14 (14a, 14b). According to the present embodiment, it is assumed that the numerical controller 12 outputs a speed command to the two motor driving devices 14 (14a, 14b). Hereinafter, the speed command will be represented by Vec.

The two motor driving devices 14 (14a, 14b) apply voltages to the windings 17 (17a, 17b) of the motor 16 on the basis of the speed command Vec, whereby three-phase alternating currents are supplied to the first winding 17a and the second winding 17b. Consequently, the motor 16 is rotated (driven). The motor driving device 14a supplies a three-phase alternating current to the first winding 17a of the motor 16 via the conductive wire L1, whereas the motor driving device 14b supplies a three-phase alternating current to the second winding 17b of the motor 16 via the conductive wire L2.

The rotational speed detecting unit 18 is a sensor that detects a rotational speed value (rotational speed value of a rotary axis) Ved of the motor 16. The rotational speed detecting unit 18 is constituted by an encoder or the like. The current detecting units 20 are provided on each of the conductive wires L (L1, L2), and detect three-phase alternating current values Id, which are supplied to the motor 16 from each of the two motor driving devices 14 (14a, 14b). The current detecting unit 20 that detects the three-phase alternating current value Id (Id1) flowing through the first winding 17a may be represented by 20a, and the current detecting unit 20 that detects the three-phase alternating current value Id (Id2) flowing through the second winding 17b may be represented by 20b in certain cases.

The two motor driving devices 14 (14a, 14b) feedback control the motor 16 using the rotational speed value Ved detected by the rotational speed detecting unit 18, and the three-phase alternating current values Id (Id1, Id2) detected by the current detecting units 20 (20a, 20b).

The abnormality diagnosing device 22 diagnoses whether driving of the motor 16 is normal or abnormal. As cases in which driving of the motor 16 is abnormal, there are included, for example, a case in which the motor 16 is driven in a state in which the windings 17 are short circuited (shorted) or the like. For example, even if the first winding 17a is short circuited, insofar as the second winding 17b is normal, the motor driving device 14b is capable of driving the motor 16. However, short circuiting of the first winding 17a causes a large current to flow through the first winding 17a, and there is a concern that the motor 16 may burn out.

The abnormality diagnosing device 22 diagnoses whether or not driving of the motor 16 is normal on the basis of the two voltage command values Vc, which are generated by the two motor driving devices 14 (14a, 14b) based on the speed command Vec. In certain cases, the voltage command value Vc generated by the motor driving device 14a may be referred to by Vc1, and the voltage command value Vc generated by the motor driving device 14b may be referred to by Vc2. Generation of the voltage command values Vc (Vc1, Vc2) will be described in detail later.

Figure 2:
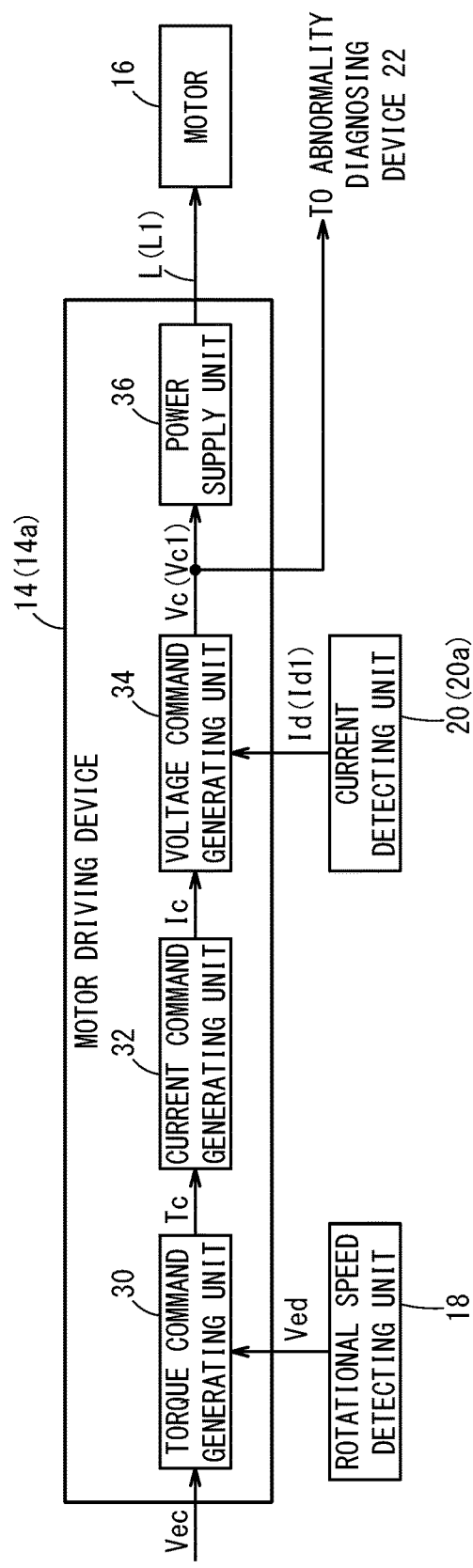
FIG. 2 is a diagram showing the configuration of a motor driving device shown in FIG. 1.

FIG. 2 is a diagram showing the configuration of a motor driving device 14a. Since the motor driving device 14b has the same configuration as that of the motor driving device 14a, the motor driving device 14a will be described as representative. The motor driving device 14a is equipped with a torque command generating unit 30, a current command generating unit 32, a voltage command generating unit 34, and a power supply unit 36.

The torque command generating unit 30 generates (calculates) a torque command value Tc on the basis of the speed command Vec commanded from the numerical controller 12. The torque command generating unit 30 generates the torque command value Tc using the rotational speed value Ved, which is a feedback value detected by the rotational speed detecting unit 18. More specifically, the torque command generating unit 30 calculates the torque command value Tc based on a difference between the speed command Vec and the rotational speed value Ved. The torque command generating unit 30 outputs the generated (calculated) torque command value Tc to the current command generating unit 32.

The current command generating unit 32 generates (calculates) a current command value Ic on the basis of the torque command value Tc transmitted thereto from the torque command generating unit 30. The current command generating unit 32 outputs the generated (calculated) current command value Ic to the voltage command generating unit 34.

The voltage command generating unit 34 generates (calculates) a voltage command value Vc1 on the basis of the current command value Ic transmitted thereto from the current command generating unit 32. The voltage command generating unit 34 generates the voltage command value Vc1 using the three-phase alternating current value (an alternating current value of the respective phases of the U-phase, the V-phase, and the W-phase) Id1, which is a feedback value detected by the current detecting unit 20a.

More specifically, the voltage command generating unit 34 generates the voltage command value Vc1 in a manner so that the three-phase alternating current value Id1, which is detected by the current detecting unit 20a, becomes a three-phase alternating current corresponding to the current command value Ic. Therefore, for example, in the case that the first winding 17a becomes short circuited and the second winding 17b remains normal, since a large current flows through the first winding 17a, the voltage command value Vc1 generated by the motor driving device 14a becomes a value that is deviated by an amount greater than or equal to the first threshold value TH1 with respect to the voltage command value Vc2 generated by the motor driving device 14b. The voltage command generating unit 34 outputs the generated (calculated) voltage command value Vc1 to the power supply unit 36, together with outputting the voltage command value Vc1 to the abnormality diagnosing device 22.

The power supply unit 36 serves as a driver for driving the motor 16, and includes, for example, an inverter circuit or the like that converts the current supplied from the power supply into a three-phase alternating current. The power supply unit 36 supplies the three-phase alternating current to the first winding 17a by applying a voltage to the first winding 17a of the motor 16 on the basis of the voltage command value Vc1. Consequently, the motor 16 is driven.

In the case of the motor driving device 14b, the voltage command generating unit 34 generates the voltage command value Vc2 using the three-phase alternating current value (an alternating current value of the respective phases of the U-phase, the V-phase, and the W-phase) Id2, which is a feedback value detected by the current detecting unit 20b. Further, on the basis of the voltage command value Vc2, the power supply unit 36 supplies the three-phase alternating current to the second winding 17b of the motor 16.

Figure 3:
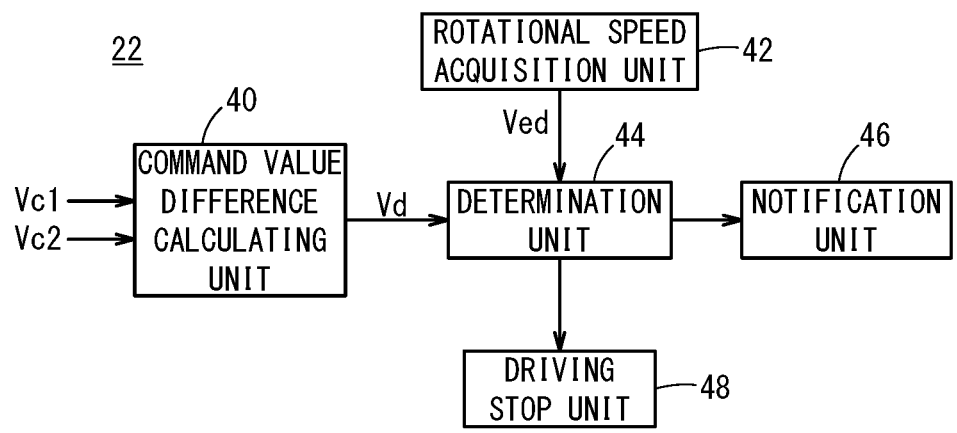
FIG. 3 is a diagram showing the configuration of an abnormality diagnosing device shown in FIG. 1.

FIG. 3 is a diagram showing the configuration of the abnormality diagnosing device 22. The abnormality diagnosing device 22 is constituted by a computer having a processor such as a central processing unit (CPU) or the like and a storage medium. The abnormality diagnosing device 22 is equipped with a command value difference calculating unit 40, a rotational speed acquisition unit 42, a determination unit 44, a notification unit 46, and a driving stop unit 48.

The command value difference calculating unit 40 calculates a difference Vd between the two voltage command values Vc (Vc1, Vc2) calculated by the two motor driving devices 14 (14a, 14b). The difference Vd is calculated by the relational expression Vd=Vc1−Vc2, or alternatively, Vd=Vc2−Vc1. The command value difference calculating unit 40 outputs the calculated difference Vd to the determination unit 44.

The rotational speed acquisition unit 42 acquires the rotational speed value Ved of the motor 16 as detected by the rotational speed detection unit 18. The rotational speed acquisition unit 42 outputs the acquired rotational speed value Ved to the determination unit 44.

The determination unit 44 includes a clock circuit that measures or clocks the passage of time. The clock circuit increments a count value C at a predetermined cycle, thereby making it possible to clock the passage of time. The determination unit 44 determines that there is an abnormality, if an absolute value of the rotational speed value Ved detected by the rotational speed detecting unit 18 exceeds a predetermined value SV (|Ved|>SV), and the absolute value of the difference Vd calculated by the command value difference calculating unit 40 exceeds the first threshold value TH 1 (|Vd|>TH1) continuously for a predetermined time period.

As for the reason for determining whether or not the absolute value of the rotational speed value Ved exceeds the predetermined value SV, it is because, in the case that the voltage command value Vc is small, the rotational speed of the motor 16 also becomes small, and there is a possibility that the abnormality determination cannot be performed correctly.

Further, as for the reason for determining whether or not the absolute value of the difference Vd exceeds the first threshold value TH1, it is because, as described above, for example, in the case that the first winding 17a becomes short circuited and the second winding 17b remains in a normal state, the voltage command value Vc1 and the voltage command value Vc2 become values that are deviated by amounts greater than or equal to the first threshold value TH1.

As for the reason for determining whether or not the predetermined time period has elapsed in the state in which the absolute value of the rotational speed value Ved is in excess of the predetermined value SV and the absolute value of the difference Vd is in excess of the first threshold value TH1, the reason is to prevent an erroneous determination of abnormality.

If it is determined by the determination unit 44 that driving of the motor 16 is abnormal, the notification unit 46 and the driving stop unit 48 carry out an alarm process.

When it is determined that driving of the motor 16 is abnormal, as the alarm process, the notification unit 46 issues a notifying alarm to the operator. The notification unit 46 may comprise a non-illustrated display unit, and may issue a notification by displaying an alarm message on the display unit. Further, the notification unit 46 may comprise a non-illustrated speaker or a light emitting unit, and may issue a notifying alarm by way of sound or light. Further, the notification unit 46 may display the notifying alarm on a display unit of the numerical controller 12. Further, the notification unit 46 may issue the notifying alarm using an externally provided speaker, or may issue the notifying alarm by causing light to be emitted from an externally provided light emitting unit.

When it is determined that driving of the motor 16 is abnormal, as the alarm process, the driving stop unit 48 stops driving of the motor 16 by the two motor driving devices 14 (14a, 14b). When it is determined that driving of the motor 16 is abnormal, the driving stop unit 48 stops driving of the motor 16 by outputting an emergency stop signal to the two motor driving devices 14 (14a, 14b). When an emergency stop signal is transmitted thereto, the two motor driving devices 14 (14a, 14b) stop the supply of power to the motor 16. For example, the voltage command generating unit 34 may stop the supply of power to the motor 16 by inhibiting output of the voltage command values Vc (Vc1, Vc2) to the power supply unit 36.

Moreover, according to the present embodiment, when it is determined that driving of the motor 16 is abnormal, both the alarm notification and stopping driving of the motor 16 are performed. However, only one of such actions may be performed as the alarm process.

Figure 4:
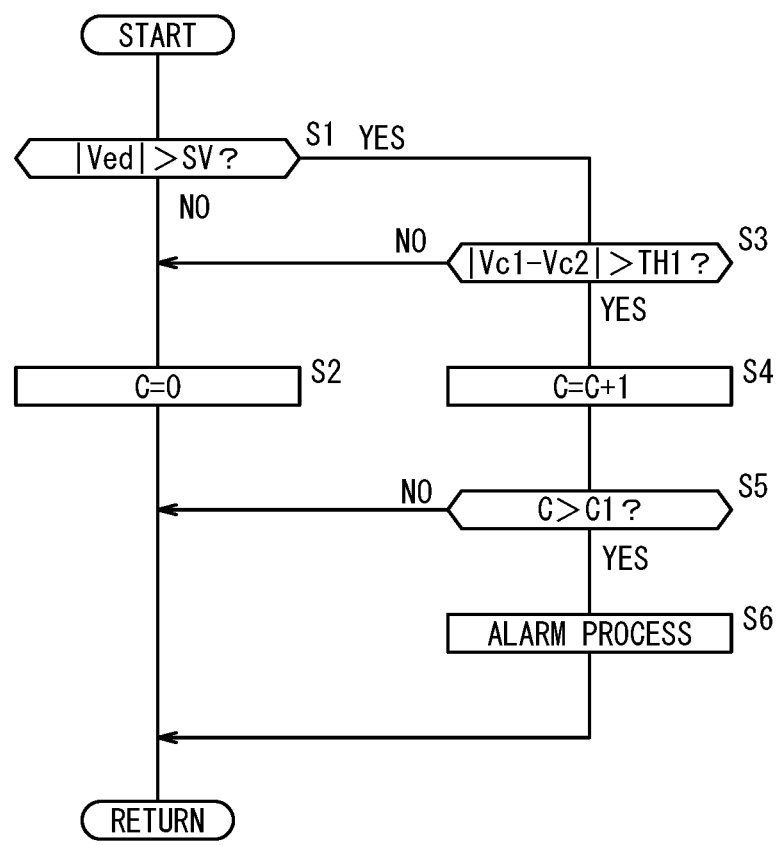
FIG. 4 is a flowchart showing operations of the abnormality diagnosing device shown in FIG. 1.

Next, operations of the abnormality diagnosing device 22 will be described with reference to the flowchart shown in FIG. 4. The operations shown in FIG. 4 are executed at a predetermined cycle. Further, it is assumed that the rotational speed detecting unit 18 and the current detecting units 20 (20a, 20b) detect the rotational speed value Ved and the alternating current values Id (Id1, Id2) at a cycle that is less than or equal to the predetermined cycle. Accordingly, the voltage command generating unit 34 generates the voltage command values Vc (Vc1, Vc2) at a cycle that is less than or equal to the predetermined cycle, and the command value difference calculating unit 40 calculates the difference Vd at a cycle that is less than or equal to the predetermined cycle.

In step S1, the determination unit 44 determines whether or not the absolute value of the rotational speed value Ved acquired by the rotational speed acquisition unit 42 is greater than the predetermined value SV (|Ved|>SV?).

If it is determined in step S1 that the absolute value of the rotational speed value Ved is less than or equal to the predetermined value SV, the process proceeds to step S2. On the other hand, if it is determined in step S1 that the absolute value of the rotational speed value Ved is greater than the predetermined value SV, the process proceeds to step S3.

Upon proceeding to step S2, the determination unit 44 resets the count value C to zero (C=0), and then the present operations are brought to an end.

Upon proceeding to step S3, the determination unit 44 determines whether or not the absolute value of the difference Vd between the voltage command values Vc (Vc1, Vc2) calculated by the command value difference calculating unit 40 is greater than the first threshold value TH1 (|Vc1−Vc2|>TH1?).

If it is determined in step S3 that the absolute value of the difference Vd is less than or equal to the first threshold value TH1, the process proceeds to step S2. On the other hand, if it is determined in step S3 that the absolute value of the difference Vd is greater than the first threshold value TH1, the process proceeds to step S4.

Upon proceeding to step S4, the determination unit 44 increments the count value C (C=C+1).

Next, in step S5, the determination unit 44 determines whether or not the current count value C is greater than a predetermined value C1. Stated otherwise, in step S5, it is determined whether or not a predetermined time period has elapsed with the states of "YES in step S1" and "YES in step S3".

If it is determined in step S5 that the current count value C is less than or equal to the predetermined value C1, the present operations are terminated, and if it is determined that the current count value C is greater than the predetermined value C1, the determination unit 44 determines that driving of the motor 16 is abnormal, and the process proceeds to step S6.

Upon proceeding to step S6, an alarm process is performed. More specifically, the notification unit 46 issues a notifying alarm to the operator, together with the driving stop unit 48 stopping driving of the motor 16 by the two motor driving devices 14 (14a, 14b).

In the foregoing manner, the abnormality diagnosing device 22 determines whether or not driving of the motor 16 is abnormal using the rotational speed value Ved, and the voltage command values Vc (Vc1, Vc2) generated by the two motor driving devices 14 (14a, 14b). Therefore, with a simple configuration, it is possible to diagnose a driving abnormality of the single motor 16 which is driven by the two motor driving devices 14 (14a, 14b).

[Modifications]

The above-described embodiment may be modified in the following manner.

<Modification 1>

Figure 5:
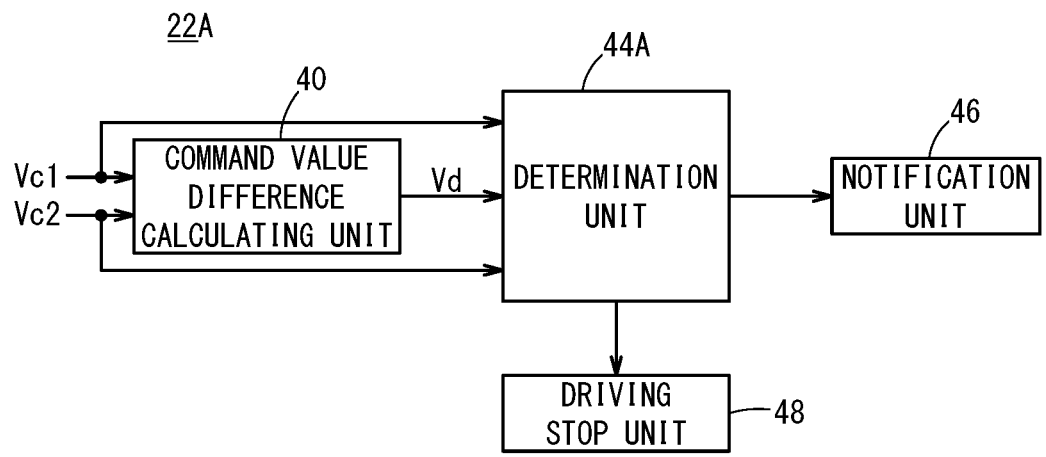
FIG. 5 is a diagram showing the configuration of an abnormality diagnosing device according to a first modification.

FIG. 5 is a diagram showing the configuration of an abnormality diagnosing device 22A according to Modification 1. Constituent features thereof which are the same as those of the above-described embodiment are assigned the same reference characters, and detailed description of such features is omitted.

The abnormality diagnosing device 22A is equipped with a command value difference calculating unit 40, a determination unit 44A, a notification unit 46, and a driving stop unit 48. Further, the voltage command values Vc (Vc1, Vc2) are input to the command value difference calculating unit 40 and the determination unit 44A.

The determination unit 44A includes the clock circuit that measures or clocks the passage of time, as was described in the aforementioned embodiment. The determination unit 44A determines that there is an abnormality, if an absolute value of at least one from among the two voltage command values Vc (Vc1, Vc2) exceeds a second threshold value TH2 (|Vc1|>TH2 or |Vc2|>TH2), and the absolute value of the difference Vd calculated by the command value difference calculating unit 40 exceeds the first threshold value TH1 (|Vd|>TH1) continuously for a predetermined time period.

As for the reason for determining whether or not the absolute value of at least one from among the two voltage command values Vc (Vc1, Vc2) exceeds the second threshold value TH2, it is because, in the case that the voltage command value Vc is small, the rotational speed of the motor 16 also becomes small, and there is a possibility that the abnormality determination cannot be performed correctly.

As for the reason for determining whether or not the absolute value of the difference Vd exceeds the first threshold value TH1, the reason is the same as in the above-described embodiment. Further, as for the reason for determining whether or not the predetermined time period has elapsed in the state in which the absolute value of at least one from among the two voltage command values Vc (Vc1, Vc2) is in excess of the second threshold value TH2 and the absolute value of the difference Vd is in excess of the first threshold value TH1, the reason is to prevent an erroneous determination of abnormality.

Figure 6:
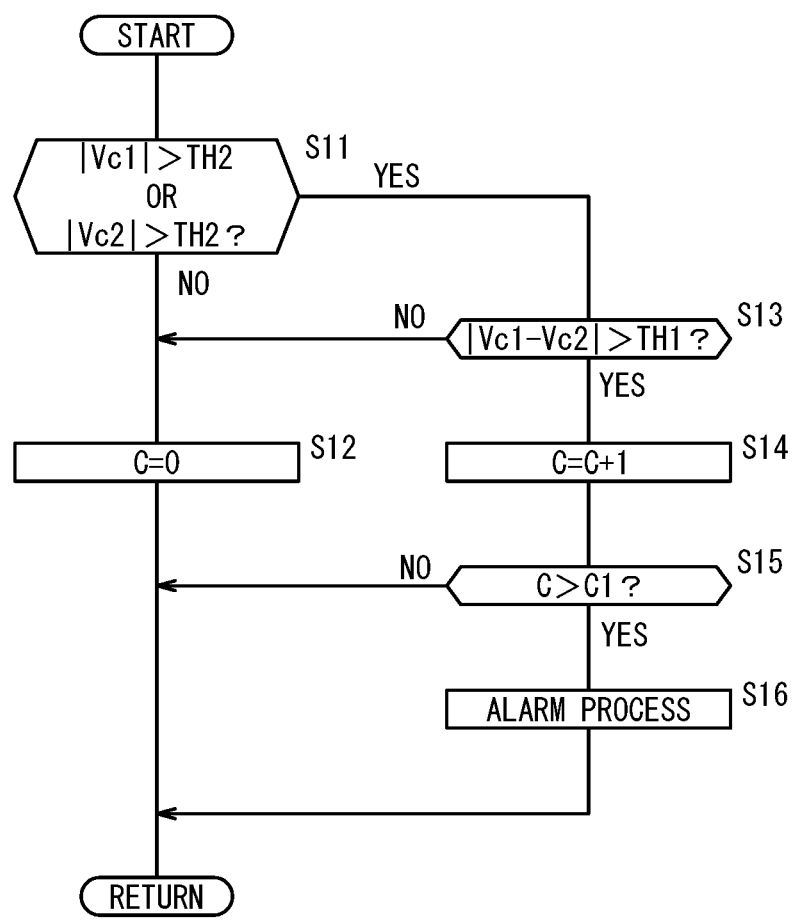
FIG. 6 is a flowchart showing operations of the abnormality diagnosing device shown in FIG. 5.

Next, operations of the abnormality diagnosing device 22A will be described with reference to the flowchart shown in FIG. 6. The operations shown in FIG. 6 are executed at a predetermined cycle also in Modification 1. Further, it is assumed that the rotational speed detecting unit 18 and the current detecting units 20 (20a, 20b) detect the rotational speed value Ved and the alternating current values Id (Id1, Id2) at a cycle that is less than or equal to the predetermined cycle. Accordingly, the voltage command generating unit 34 generates the voltage command values Vc (Vc1, Vc2) at a cycle that is less than or equal to the predetermined cycle, and the command value difference calculating unit 40 calculates the difference Vd at a cycle that is less than or equal to the predetermined cycle.

In step S11, the determination unit 44A determines whether or not the absolute value of the voltage command value Vc1 is greater than the second threshold value TH2, or the absolute value of the voltage command value Vc2 is greater than the second threshold value TH2 (|Vc1|>TH2? or |Vc2|>TH2?). Stated otherwise, in step S11, it is determined whether or not the absolute value of at least one of the voltage command values Vc1, Vc2 is greater than the second threshold value TH2.

If it is determined in step S11 that the absolute value of the voltage command values Vc1, Vc2 is less than or equal to the second threshold value TH2, the process proceeds to step S12. On the other hand, if it is determined in step S11 that the absolute value of at least one of the voltage command values Vc1, Vc2 is greater than the second threshold value TH2, the process proceeds to step S13.

Upon proceeding to step S12, the determination unit 44A resets the count value C to zero (C=0), and then the present operations are brought to an end.

Upon proceeding to step S13, the determination unit 44A determines whether or not the absolute value of the difference Vd between the voltage command values Vc (Vc1, Vc2) calculated by the command value difference calculating unit 40 is greater than the first threshold value TH1 (|Vc1−Vc2|>TH1?).

If it is determined in step S13 that the absolute value of the difference Vd is less than or equal to the first threshold value TH1, the process proceeds to step S12. On the other hand, if it is determined in step S13 that the absolute value of the difference Vd is greater than the first threshold value TH1, the process proceeds to step S14.

Upon proceeding to step S14, the determination unit 44A increments the count value C (C=C+1).

Next, in step S15, the determination unit 44A determines whether or not the current count value C is greater than a predetermined value C1. Stated otherwise, in step S15, it is determined whether or not a predetermined time period has elapsed with the states of "YES in step S11" and "YES in step S13".

If it is determined in step S15 that the current count value C is less than or equal to the predetermined value C1, the present operations are terminated, and if it is determined that the current count value C is greater than the predetermined value C1, the determination unit 44A determines that driving of the motor 16 is abnormal, and the process proceeds to step S16.

Upon proceeding to step S16, an alarm process is performed. More specifically, the notification unit 46 issues a notifying alarm to the operator, together with the driving stop unit 48 stopping driving of the motor 16 by the two motor driving devices 14 (14a, 14b).

In the foregoing manner, the abnormality diagnosing device 22A determines whether or not driving of the motor 16 is abnormal using the voltage command values Vc (Vc1, Vc2) generated by the two motor driving devices 14 (14a, 14b). Therefore, with a simple configuration, it is possible to diagnose a driving abnormality of the single motor 16 which is driven by the two motor driving devices 14 (14a, 14b).

<Modification 2>

In the above-described embodiment and Modification 1, the abnormality diagnosing device 22 (22A) is provided separately from the numerical controller 12 and the motor driving devices 14. However, the abnormality diagnosing device 22 (22A) may be constituted by the numerical controller 12. Stated otherwise, the abnormality diagnosing device 22 (22A) may be provided within the numerical controller 12. In accordance with this feature, there is no need to separately provide the abnormality diagnosing device 22 (22A), thus resulting in a reduction in costs.

The abnormality diagnosing device 22 (22A) may also be constituted by the motor driving devices 14. Stated otherwise, the abnormality diagnosing device 22 (22A) may be provided within the motor driving devices 14. In this case, the abnormality diagnosing device 22 (22A) may be provided in at least one of the plurality of motor driving devices 14, or the abnormality diagnosing device 22 (22A) may be provided in all of the plurality of motor driving devices 14. In accordance with this feature, there is no need to separately provide the abnormality diagnosing device 22 (22A), costs can be reduced, and the abnormality diagnosis can be performed promptly.

<Modification 3>

The determination unit 44 (44A) may simply determine the presence of an abnormality in the event that the absolute value of the difference Vd exceeds the first threshold value TH1 continuously for a predetermined period of time. In this case, the operation of step S1 of FIG. 4 or the operation of step S11 of FIG. 6 becomes unnecessary, and initially, the operation of step S3 or the operation of step S13 is performed.

<Modification 4>

In the flowchart of FIG. 4, with the states of "YES in step S1" and "YES in step S3", the process proceeds to step S6 in the case that the predetermined time period has elapsed. However, the process may proceed to step S6 at the point in time when the answer becomes YES in step S1, and the answer becomes YES in step S3. Similarly, in the flowchart of FIG. 6, with the states of "YES in step S11" and "YES in step S13", the process proceeds to step S16 in the case that the predetermined time period has elapsed. However, the process may proceed to step S16 at the point in time when the answer becomes YES in step S11, and the answer becomes YES in step S13.

<Modification 5>

In the above-described embodiment and Modifications 1 to 4, the numerical controller 12 outputs the speed command Vec to the two motor driving devices 14 (14a, 14b). However, the speed command Vec may be output only to either one of the motor driving devices 14. Moreover, in the description of Modification 5, the motor driving device 14 to which the speed command Vec is input is 14a, and the motor driving device 14 to which the speed command Vec is not input is 14b.

In addition, the motor driving device 14a outputs the torque command value Tc, which was generated on the basis of the speed command Vec, or the current command value Ic, which was generated on the basis of the torque command value Tc, to the motor driving device 14b. In the case that the torque command value Tc is input to the motor driving device 14b, the current command generating unit 32 of the motor driving device 14b generates the current command value Ic on the basis of the input torque command value Tc. Further, in the case that the current command value Ic is input to the motor driving device 14b, the voltage command generating unit 34 of the motor driving device 14b generates the voltage command value Vc2 on the basis of the current command value Ic input thereto, and the alternating current value Id2, which is a feedback value.

[Technical Concepts Obtained from the Embodiments]

Technical concepts which can be grasped from the above-described embodiments and Modifications 1 to 5 will be described below.

The abnormality diagnosing device (22, 22A) diagnoses a driving abnormality of the single motor (16) that is driven by the plurality of motor driving devices (14). The plurality of motor driving devices (14) calculate a plurality of voltage command values (Vc) on the basis of a position command or a speed command commanded from the numerical controller (12), and based on the plurality of calculated voltage command values (Vc), voltages are applied to the plurality of windings (17) possessed by the motor (16), thereby driving the motor (16). The abnormality diagnosing device (22, 22A) is equipped with the command value difference calculating unit (40) adapted to calculate a difference (Vd) between the plurality of voltage command values (Vc) calculated by the plurality of motor driving devices (14), and the determination unit (44, 44A) adapted to determine the presence of an abnormality, in the event that an absolute value of the difference (Vd) calculated by the command value difference calculating unit (40) exceeds the first threshold value (TH1) continuously for a predetermined time period.

In accordance with these features, with a simple configuration, it is possible to diagnose a driving abnormality (for example, a driving abnormality due to short circuiting or the like of the windings (17)) of the single motor (16) which is driven by the plurality of motor driving devices (14).

The abnormality diagnosing device (22) may further be equipped with the rotational speed acquisition unit (42) adapted to acquire a rotational speed value (Ved) of the motor (16). The determination unit (44) may determine that there is an abnormality, if an absolute value of the rotational speed value (Ved) exceeds a predetermined value (SV), and the absolute value of the difference (Vd) exceeds the first threshold value (TH1) continuously for the predetermined time period. Consequently, with a simple configuration, a driving abnormality of the single motor (16) that is driven by the plurality of motor driving devices (14) can be diagnosed. Further, since abnormality diagnosis is not performed in the case that the motor (16) is not undergoing rotation or the like, it is possible to prevent diagnosis of abnormalities from being performed needlessly.

The determination unit (44A) may determine that there is an abnormality, if an absolute value of at least one from among the plurality of voltage command values (Vc) exceeds a second threshold value (TH2), and the absolute value of the difference (Vd) exceeds the first threshold value (TH1) continuously for the predetermined time period. Consequently, with a simple configuration, a driving abnormality of the single motor (16) that is driven by the plurality of motor driving devices (14) can be diagnosed. Further, since abnormality diagnosis is not performed in the case that the motor (16) is not being driven or the like, it is possible to prevent diagnosis of abnormalities from being performed needlessly.

The abnormality diagnosing device (22, 22A) may further be equipped with the notification unit (46) adapted to issue a notifying alarm if the presence of an abnormality is determined by the determination unit (44, 44A). Owing to this feature, the operator can recognize that a driving abnormality of the motor (16) has occurred.

The abnormality diagnosing device (22, 22A) may further be equipped with the driving stop unit (48) adapted to stop driving of the motor (16) by the plurality of motor driving devices (14) if the presence of an abnormality is determined by the determination unit (44, 44A). In accordance with this feature, it is possible to prevent the motor (16) from becoming damaged or broken due to a driving abnormality of the motor (16).

The abnormality diagnosing device (22, 22A) may be provided in the motor driving device (14). In accordance with this feature, there is no need to separately provide the abnormality diagnosing device (22, 22A), costs can be reduced, and the abnormality diagnosis can be performed promptly.

Although certain preferred embodiments of the present invention have been shown and described in detail, it should be understood that various changes and modifications may be made therein without departing from the scope of the appended claims.

What is claimed is:

1. An abnormality diagnosing device adapted to diagnose a driving abnormality of a single motor that is driven by a plurality of motor driving devices;
   wherein the plurality of motor driving devices calculate a plurality of voltage command values on a basis of a position command or a speed command commanded from a numerical controller, and based on the plurality of calculated voltage command values, voltages are applied to a plurality of windings possessed by the motor, thereby driving the motor;
   the abnormality diagnosing device comprising:
   a command value difference calculating unit adapted to calculate a difference between the plurality of voltage command values calculated by the plurality of motor driving devices; and
   a determination unit adapted to determine a presence of an abnormality, in an event that an absolute value of the difference calculated by the command value difference calculating unit exceeds a first threshold value continuously for a predetermined time period.

2. The abnormality diagnosing device according to claim 1, further comprising:
   a rotational speed acquisition unit adapted to acquire a rotational speed value of the motor;
   wherein the determination unit determines that there is an abnormality, if an absolute value of the rotational speed value exceeds a predetermined value, and the absolute value of the difference exceeds the first threshold value continuously for the predetermined time period.

3. The abnormality diagnosing device according to claim 1, wherein the determination unit determines that there is an abnormality, if an absolute value of at least one from among the plurality of voltage command values exceeds a second threshold value, and the absolute value of the difference exceeds the first threshold value continuously for the predetermined time period.

4. The abnormality diagnosing device according to claim 1, further comprising a notification unit adapted to issue a notifying alarm if the presence of an abnormality is determined by the determination unit.

5. The abnormality diagnosing device according to claim 1, further comprising a driving stop unit adapted to stop driving of the motor by the plurality of motor driving devices if the presence of an abnormality is determined by the determination unit.

6. The abnormality diagnosing device according to claim 1, wherein the abnormality diagnosing device is provided in the motor driving device.

7. An abnormality diagnosing method for diagnosing a driving abnormality of a single motor that is driven by a plurality of motor driving devices;
   wherein the plurality of motor driving devices calculate a plurality of voltage command values on a basis of a position command or a speed command commanded from a numerical controller, and based on the plurality of calculated voltage command values, voltages are applied to a plurality of windings possessed by the motor, thereby driving the motor;
   the abnormality diagnosing method comprising:
   a command value difference calculating step of calculating a difference between the plurality of voltage command values calculated by the plurality of motor driving devices; and
   a determining step of determining a presence of an abnormality, in an event that an absolute value of the difference calculated by the command value difference calculating step exceeds a first threshold value continuously for a predetermined time period.

8. The abnormality diagnosing method according to claim 7, further comprising:
   a rotational speed acquiring step of acquiring a rotational speed value of the motor;
   wherein the determining step determines that there is an abnormality, if an absolute value of the rotational speed value exceeds a predetermined value, and the absolute value of the difference exceeds the first threshold value continuously for the predetermined time period.

9. The abnormality diagnosing method according to claim 7, wherein the determining step determines that there is an abnormality, if an absolute value of at least one from among the plurality of voltage command values exceeds a second threshold value, and the absolute value of the difference exceeds the first threshold value continuously for the predetermined time period.

10. The abnormality diagnosing method according to claim 7, further comprising a notifying step of issuing a notifying alarm if the presence of an abnormality is determined by the determining step.

11. The abnormality diagnosing method according to claim 7, further comprising a driving stop step of stopping driving of the motor by the plurality of motor driving devices if the presence of an abnormality is determined by the determining step.

\* \* \* \* \*